US012633725B2

(12) United States Patent     (10) Patent No.:   US 12,633,725 B2

Chen et al.     (45) Date of Patent:    May 19, 2026

(54) STRAIN-ENGINEERED CLADDING LAYER FOR OPTIMIZED ACTIVE REGION STRAIN AND IMPROVED LASER DIODE PERFORMANCE

(71) Applicant: NLIGHT, INC., Camas, WA (US)

(72) Inventors: Zhigang Chen, Portland, OR (US); Manoj Kanskar, Portland, OR (US)

(73) Assignee: nLIGHT, Inc., Camas, WA (US)

( * ) Notice: Subject to any disclaimer, the term of this patent is extended or adjusted under 35 U.S.C. 154(b) by 972 days.

(21) Appl. No.: 17/761,188

(22) PCT Filed: Sep. 15, 2020

(86) PCT No.: PCT/US2020/050925

§ 371 (c)(1),
(2) Date: Mar. 16, 2022

(87) PCT Pub. No.: WO2021/067033

PCT Pub. Date: Apr. 8, 2021

(65) Prior Publication Data

US 2022/0368108 A1     Nov. 17, 2022

Related U.S. Application Data

(60) Provisional application No. 62/908,518, filed on Sep. 30, 2019.

(51) Int. Cl.
*H01S 5/32*     (2006.01)
*H01S 5/20*     (2006.01)
*H01S 5/34*     (2006.01)

(52) U.S. Cl.
CPC .......... *H01S 5/2031* (2013.01); *H01S 5/3218* (2013.01); *H01S 5/3403* (2013.01)

(58) Field of Classification Search
CPC ....... H01S 5/3403–3406; H01S 5/3201; H01S 5/3218
See application file for complete search history.

(56) References Cited

U.S. PATENT DOCUMENTS 3,855,546 A  *  12/1974   Carr .......................... H01S 5/02
                                        372/36
5,048,036 A      9/1991   Scifres (Continued)

FOREIGN PATENT DOCUMENTS

JP      H05-243669 A     9/1993
JP      H07312465 A     11/1995

(Continued)

OTHER PUBLICATIONS

Federal Institute of Industrial Property; International Search Report and Written Opinion PCT/US2020/050925 dated Dec. 3, 2020; 8 Pages.

(Continued)

*Primary Examiner* — Tod T Van Roy
*Assistant Examiner* — Delma R Forde
(74) *Attorney, Agent, or Firm* — Wiley Rein LLP

(57)        ABSTRACT

Some embodiments may include a laser diode having a strain-engineered cladding layer for optimized active region strain and improved laser diode performance. In one embodiment, the laser diode may include a semiconductor substrate having a material composition with a first lattice constant; and a plurality of epitaxy layers form on the semiconductor substrate, with plurality of epitaxy layers including a waveguide layer and cladding layers, wherein the waveguide layer includes an active region having a material composition associated with a target optical wavelength, wherein a second lattice constant of the material composition of the active region is different than the first lattice constant; wherein a material composition and/or (Continued)

$$\text{Al}_{0.6}\text{Ga}_{0.4}\text{As}_{y2}\text{P}_{1\text{-}y2} \text{ p-clad}$$

$$\text{Al}_{0.6}\text{Ga}_{0.4}\text{As}_{y1}\text{P}_{1\text{-}y1} \text{ p-clad}$$

$$\text{Al}_{0.6}\text{Ga}_{0.4}\text{As}_{y2}\text{P}_{1\text{-}y2} \text{ p-clad}$$

$$\text{Al}_{0.6}\text{Ga}_{0.4}\text{As}_{y1}\text{P}_{1\text{-}y1} \text{ p-clad}$$

$$\text{Al}_{0.6}\text{Ga}_{0.4}\text{As}_{y2}\text{P}_{1\text{-}y2} \text{ p-clad}$$

$$\text{Al}_{0.6}\text{Ga}_{0.4}\text{As}_{y1}\text{P}_{1\text{-}y1} \text{ p-clad}$$

thickness of an individual cladding layer of the cladding layers is/are arranged to impart a target stress field on the active region to optimize active region strain. Other embodiments may be disclosed and/or claimed.

18 Claims, 3 Drawing Sheets

(56) References Cited

U.S. PATENT DOCUMENTS

| | | | |
|---|---|---|---|
| 5,218,613 A | 6/1993 | Serreze | |
| 5,408,487 A | 4/1995 | Uchida et al. | |
| 5,838,705 A * | 11/1998 | Shieh | H01S 5/18308 257/97 |
| 2003/0150376 A1 | 8/2003 | Homewood et al. | |
| 2007/0053396 A1 | 3/2007 | Devito | |
| 2011/0168977 A1 | 7/2011 | Eichler | |
| 2018/0375290 A1 | 12/2018 | Miyasaka | |
| 2020/0167022 A1 | 5/2020 | Rihn | |

FOREIGN PATENT DOCUMENTS

| | | | |
|---|---|---|---|
| JP | H09-283856 A | 10/1997 | |
| JP | H10-215021 A | 8/1998 | |
| JP | H10215021 * | 8/1998 | H01S 5/00 |
| JP | 2008-034851 A | 2/2008 | |
| WO | 97/50158 A1 | 12/1997 | |
| WO | 2020/161865 A1 | 8/2020 | |

OTHER PUBLICATIONS

Federal Institute of Industrial Property; International Preliminary Report on Patentability PCT/US2020/050925 dated Apr. 14, 2022; 6 Pages.

European Patent Office; Supplementary European Search Report; EP App. No. EP20871282; pp. 1-8.

Notice of Refusal for Japanese Patent Application No. 2022-520057, dated Feb. 13, 2024.

European Patent Office; International Search Report and Written Opinion PCT/US2020/050925 dated Dec. 3, 2020; 8 Pages.

Decision to Grant for Japanese Patent Application No. 2022-520057, dated Jun. 11, 2024.

* cited by examiner $Al_{0.6}Ga_{0.4}As_{0.98}P_{0.02}$ p-clad

FIG. 4A

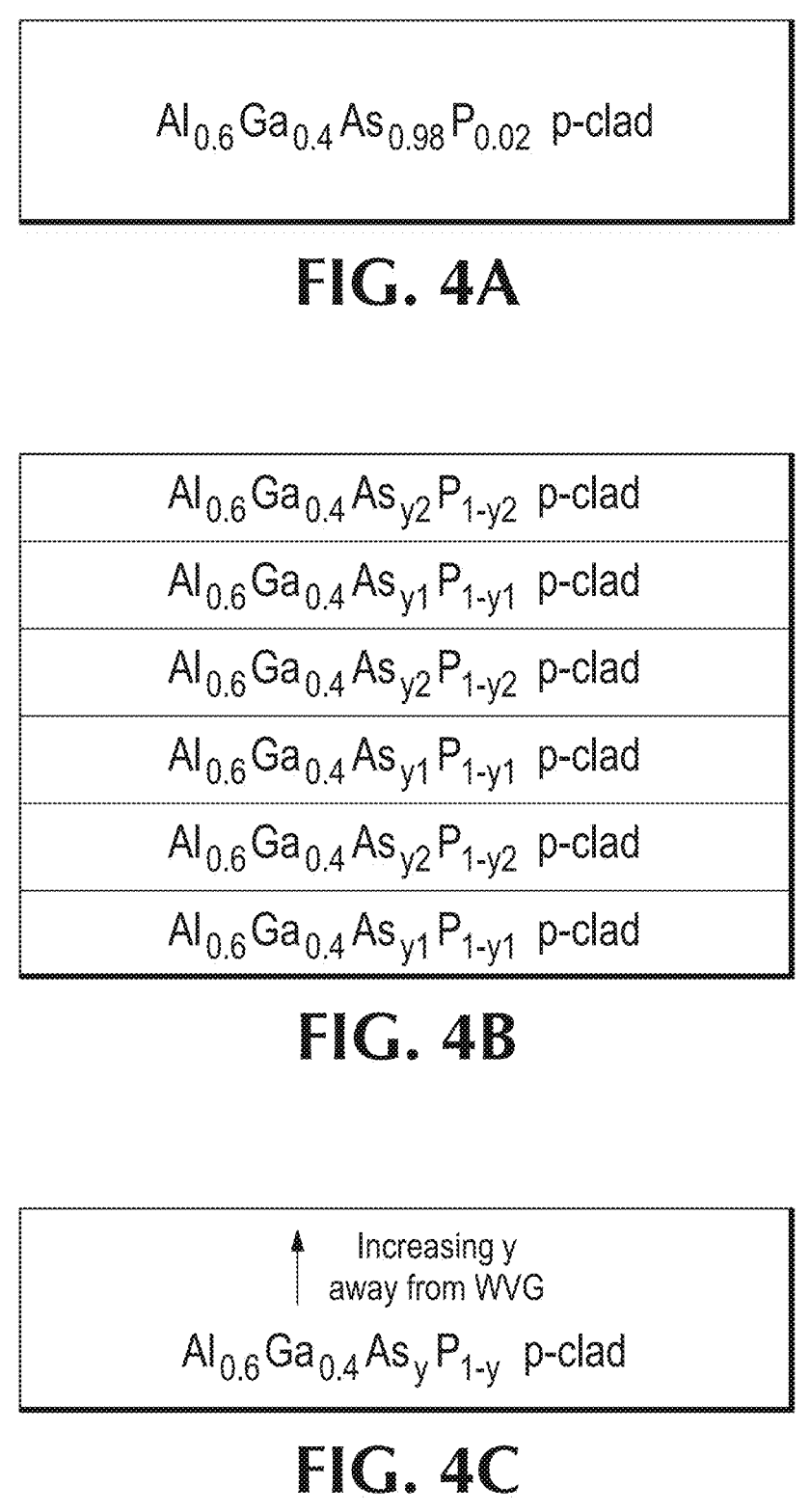

$Al_{0.6}Ga_{0.4}As_{y2}P_{1-y2}$ p-clad $Al_{0.6}Ga_{0.4}As_{y1}P_{1-y1}$ p-clad $Al_{0.6}Ga_{0.4}As_{y2}P_{1-y2}$ p-clad $Al_{0.6}Ga_{0.4}As_{y1}P_{1-y1}$ p-clad $Al_{0.6}Ga_{0.4}As_{y2}P_{1-y2}$ p-clad $Al_{0.6}Ga_{0.4}As_{y1}P_{1-y1}$ p-clad

FIG. 4B

↑ Increasing y
away from WVG $Al_{0.6}Ga_{0.4}As_{y}P_{1-y}$ p-clad

FIG. 4C

STRAIN-ENGINEERED CLADDING LAYER FOR OPTIMIZED ACTIVE REGION STRAIN AND IMPROVED LASER DIODE PERFORMANCE

RELATED APPLICATIONS

The present application is a National Phase entry under 35 U.S.C. § 371 of International Application No. PCT/US2020/050925, filed on Sep. 15, 2020, which claims priority to U.S. Provisional Application No. 62/908,518, filed on Sep. 30, 2019, the entire contents of these applications are incorporated herein by reference in their entirety.

TECHNICAL FIELD

The present disclosure relates to laser diodes.

BACKGROUND

Fiber lasers are widely used in industrial processes (e.g., cutting, welding, cladding, heat treatment, etc.) In some fiber lasers, the optical gain medium includes one or more active optical fibers with cores doped with rare-earth element(s). The rare-earth element(s) may be optically excited ("pumped") with light from one or more semiconductor laser sources. There is great demand for high power and high efficiency diode lasers, the former for power scaling and price reduction (measured in $/Watt) and the latter for reduced energy consumption and extended lifetime.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

Figure 2:
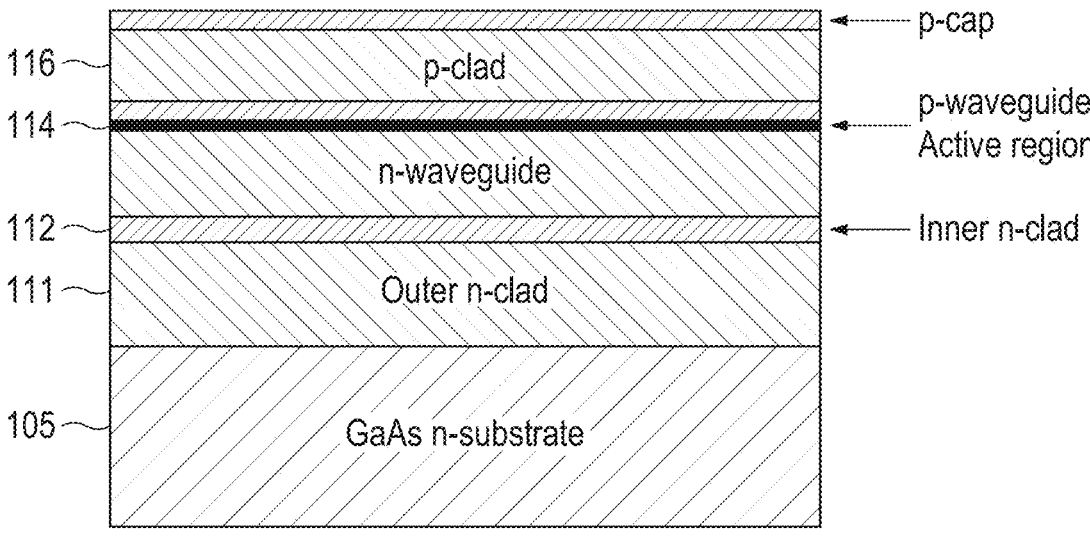
FIG. 2 illustrates a cross-sectional view of another epitaxial layer structure of a laser diode, according to some embodiments.

FIGS. 4A-C are block diagrams illustrating configurations of the cladding layer of FIG. 2, according to some embodiments.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The term "or" refers to "and/or," not "exclusive or" (unless specifically indicated).

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

Figure 1:
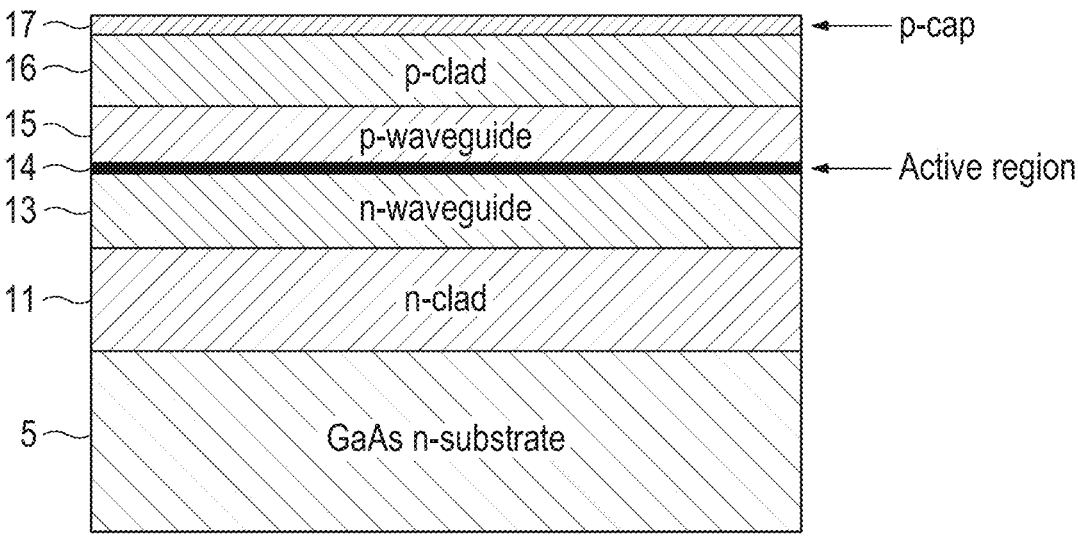
FIG. 1 illustrates a cross-sectional view of an epitaxial layer structure of a laser diode, according to some embodiments.

Strain engineering of the active region (e.g., quantum wells) is one approach to improve the performance of high power laser diodes. The introduction of strain in the active region may modify the band structure, leading to reduced threshold current density and increased differential gain. An active region with an optimized strain level may significantly improve performance of high power laser diodes, including power efficiency (as compared to an active region without the optimized strain level). However, wavelength constraints may prevent known strain engineering of the active region alone from obtaining the optimized strain level in the active region. Utilization of a strain-engineered cladding layer to provide an optimized strain level in the active region may improve diode performance FIG. 1 illustrates a cross-sectional view of an epitaxial layer structure of a large optical cavity (LOC) laser diode. The LOC laser diode includes an n-doped GaAs substrate 5, an n-clad layer 11, an n-waveguide layer 13, an active region 14 (e.g., quantum wells or quantum dots), a p-waveguide layer 15, a p-clad layer 16, and a cap layer 17, e.g., a p-type cap layer (p-cap). In some 900nm or greater LOC laser diodes, the p-cladding layer 16 may include thick $Al_{0.6}Ga_{0.4}As$ material. The lattice mismatch between the thick $Al_{0.6}Ga_{0.4}As$ material and the GaAs substrate 5 may lead to a reduced compressive strain in the active region, which may negatively impact observed threshold current and slope efficiency of the LOC laser diode.

In some LOC laser diodes, such as the one shown in FIG. 1, the p-side of the vertical waveguide may contribute significantly to the overall waveguide thickness. Diode laser designs with significantly reduced p-waveguide thickness (e.g., large quantum well offset to the p-side of the waveguide) may mitigate electrical series resistance originated in the p-waveguide, the optical loss and leakage currents that are associated with carrier accumulation in the p-waveguide under large forward bias, and therefore may lead to lower voltage, higher slope efficiency and power, and higher wall plug efficiency. FIG. 2 illustrates a cross-sectional view of one such embodiment (in which the p-waveguide thickness may be significantly reduced in a laser diode and/or a double n-clad structure may be utilized).

Similar to the LOC laser diode of FIG. 1, a degree of lattice mismatch between a material of the p-cladding layer 116 and the GaAs substrate 105 may lead to a reduced compressive strain in the active region 114, especially where the active region 114 is located very close to the p-cladding layer 116 so that the stress field from the p-cladding layer is stronger, negatively impacting observed threshold current and slope efficiency of the diode lasers. This embodiment also includes a double n-clad structure including an outer n-clad 111 and an inner n-clad 112. Other layers in this embodiment may be similar to any other layers of an LOC laser diode.

In one example the p-cladding layer 116 may include $Al_{0.6}Ga_{0.4}As$ The room temperature lattice mismatch between $Al_{0.6}Ga_{0.4}As$ and GaAs is ~0.08%, so in the example in which the p-cladding layer 116 is $Al_{0.6}Ga_{0.4}As$ it is under a compressive strain of ~0.08%. Although this lattice mismatch is small, the bulk layer of the $Al_{0.6}Ga_{0.4}As$ material may be thick enough to impart a stress field that may lead to wafer bowing in the wafer fabrication process. Also, the stress field from the strained p-cladding layer 116 may propagate to the active region 114, partially relaxing, in the active region 114, the compressive strain that may be critical to achieving the high performance of the diode laser (proper level of strain in the active region 114 changes the band structure, leading to reduced threshold current, improved differential gain and slope efficiency).

Some embodiments described herein may strain-compensate a cladding layer by changing its material composition and/or thickness to change the degree of lattice mismatch to impart optimal strain on an active region. In some embodiments, the approach is through incorporation of a strain compensating material into the cladding layer (e.g., phosphorus incorporation into AlGaAs—replacing part of the arsenic atoms in the AlGaAs cladding layer with phosphorus atoms). This strain compensating material may change the cladding layer's lattice constant to differently match that of GaAs to impart a stress field on the active region. In a diode laser design with significantly reduced p-waveguide thickness that has its p-cladding layer completely strain-compensated to suppress strain relaxation on the active region, it is expected that the full performance potential in the thin p-waveguide design under optimized quantum well strain can be recovered in the strain-compensated design, in the form of lower threshold current, higher slope efficiency and higher power at large drive current.

The level of strain compensation in the AlGaAsP p-cladding may be optimized for optimal active region strain. Because of the wavelength constraint in some diode lasers, there is a predetermined composition, say InGaAs, in the active region. The predetermined composition may apply a predetermined strain in the active region, which may not have the ideal active region strain level (for example, InGaAs active region compressive strain in 915-nm diodes is lower than the optimized value for best performance). An AlGaAsP p-cladding with optimized strain can mitigate this constraint on diode performance. For example, for 915-nm diodes, a slightly tensile strained $Al_{0.6}Ga_{0.4}AsP$ (phosphorus composition more than 2.5%) can be used to impart a stress field on the active region to provide an increased InGaAs quantum well compressive strain.

Figure 3A:
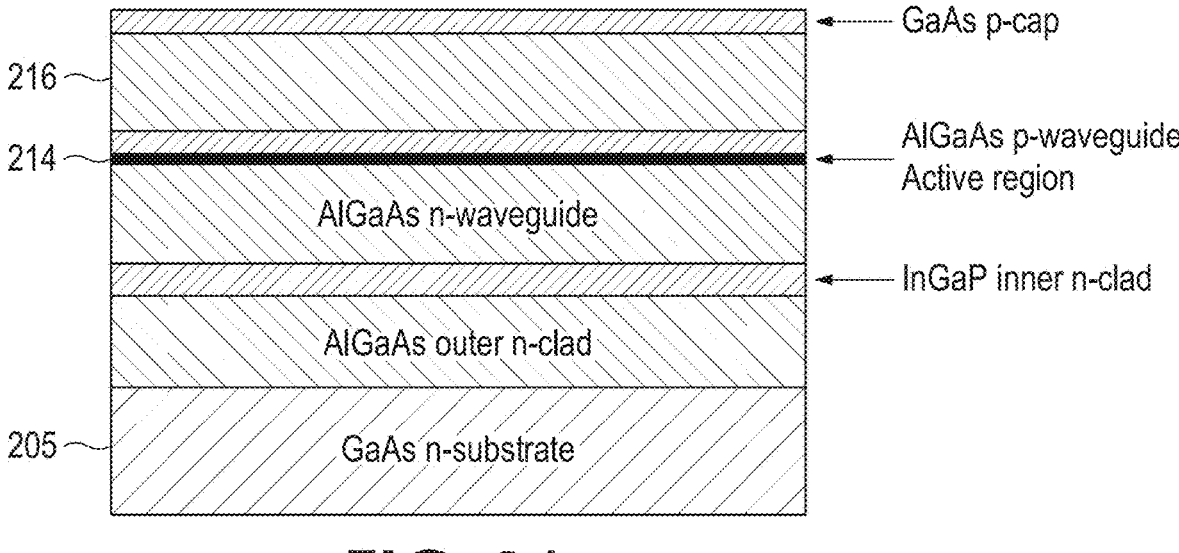
FIG. 3A illustrates a cross-sectional view of an epitaxial layer structure of a laser diode in which a cladding layer is strain-engineered for optimizing active region strain and improved laser diode performance, according to some embodiments.

FIG. 3A illustrates a cross-sectional view of an epitaxy layer structure having a strain-engineered cladding layer for optimized active region strain and improved diode laser performance. Semiconductor substrate 205 and active layer 214, and any intervening layers, may be similar to semiconductor substrate 105 and active layer 114 and any intervening layers (FIG. 2). Cladding layer 216 may be strain-engineered to impart a stress field on the active region 214 to optimize strain in the active region 214 for improved diode performance. In one example, the thickness of cladding layer 216 is the same as cladding layer 116 (FIG. 2), but cladding layer 216 includes a strain compensated material. In other embodiments, any strain-engineered cladding layer may have a strain-engineered thickness and/or strain-engineered composition to impart a stress field on an active region.

Figure 3B:
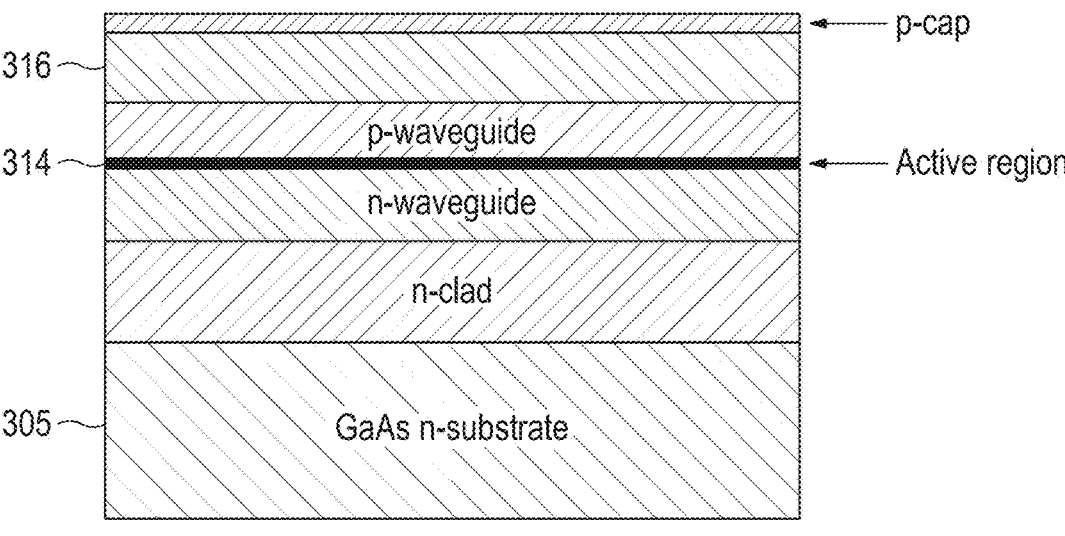
FIG. 3B illustrates a cross-sectional view of another epitaxial layer structure of a laser diode in which a cladding layer is strain-engineered for optimizing active region strain and improved laser diode performance, according to some embodiments.

The laser diode of FIG. 3A utilizes a thin p-waveguide design (in which a thickness of a p-waveguide section is substantially less than a thickness of an n-waveguide section of the waveguide layer); however, this is not required to utilize a strain-engineered cladding layer for optimized active region strain and improved laser diode performance. In some thin p-waveguide design embodiments, the thickness of the p-waveguide section may be less than 30% of a thickness of the n-waveguide section (other ratios may be possible and practical in other embodiments of a thin p-waveguide design). FIG. 3B illustrates a cross-sectional view of an epitaxy layer structure similar to the epitaxy layer structure shown in FIG. 1 (e.g., a fiber laser having an LOC) with a strain-engineered cladding layer 216. Semiconductor substrate 305 and active layer 314, and any intervening layers, may be similar to semiconductor substrate 5 and active layer 14 and any intervening layers (FIG. 1). Cladding layer 316 may be strain-engineered to impart a stress field on the active region 314 to optimize strain in the active region 314 for improved diode performance. In one example, the thickness of cladding layer 316 is the same as cladding layer 16 (FIG. 1), but cladding layer 316 includes a strain compensated material. In other embodiments, any strain-engineered cladding layer may have a strain-engineered thickness and/or strain-engineered composition to impart a stress field on an active region.

Referring to FIGS. 4A-C, a strain adjusting material incorporated into the cladding layers 216 and/or 316 (FIGS. 3A-B, respectively) may be uniformly distributed in a portion of the cladding layer or non-uniformly distributed in the portion of the cladding layers 216 and/or 316. FIG. 4A illustrates an example in which the strain adjusting material is uniformly distributed throughout the cladding layers 216 and/or 316. In the illustrated example, in which the strain adjusting material is Phosphorus, the material composition of the cladding layers 216 and/or 316 is $Al_{0.6}Ga_{0.4}As_{0.98}P_{0.02}$. While a slightly different material composition, $Al_{0.6}Ga_{0.4}As_{0.98}P_{0.025}$, has zero lattice mismatch with GaAs at room temperature; using it as the p-cladding layer may completely remove the stress field it applies to an active region. Use of a material composition that is lattice mismatch to the substrate, such as $Al_{0.6}Ga_{0.4}As_{0.98}P_{0.02}$, may impart a non-zero stress field on the active region, which may optimize strain in the active region, which may provide improved laser diode performance.

Although it may be desirable to arrange the cladding layer to impart some stress field or zero stress field on the active region at room temperature, there is an additional constraint on cladding layer strain engineering because there is a threshold strain-thickness product value that the diode epitaxy structure should not exceed at growth temperature, to prevent the formation of dislocation and wafer cracking. Therefore, in some embodiments a thickness of the cladding layer may also be changed based a threshold strain-thickness product value to impart the desired stress field without the formation of dislocation and wafer cracking. Furthermore, the strain adjusting material may be localized closer to or further from the active region (e.g., non-uniformly distributed and/or uniformly distributed in one of a plurality of sections of the cladding layer). FIG. 4C illustrates non-uniform distribution using a gradient material composition in which a concentration of the strain adjusting material varies as distance from the active region increases.

FIG. 4B illustrates another example in which the strain adjusting material may still be uniformly distributed within individual sections (but concentration may be different in at least two of the individual sections). One embodiment similar to FIG. 4B may employ a superlattice cladding layer design that has alternating layers of AlGaAsP with different phosphorus compositions and different strain levels. The phosphorus compositions and strain levels of the alternating layers of AlGaAsP may be chosen to have a zero average strain or a desired average strain level. The lattice mismatch between the alternating AlGaAsP layers of different strain may be localized so that there may be no (or little) dislocation event though the cumulative strain-thickness product may exceed the critical value. An embodiment similar to FIG. 4C may have a AlGaAsP p-cladding layer with varying phosphorus composition, with zero or less compressive strain closer to the waveguide and larger compressive strain away from the active region (e.g., an active well). The active region now sits further away from the more strained AlGaAsP cladding layer, hence experiences less stress field. On the other hand, the gradient phosphorus composition in the cladding layer may reduce the cumulative strain-thickness product value at growth temperature to lower than the critical value.

Material Composition of a Strain-Engineered Cladding Layer

A strain-engineered cladding layer of a laser diode may incorporate a strain adjusting material into a composition that would otherwise be lattice matched (or non-optimally lattice mismatched with the semiconductor substrate) to impart a target stress field on the active region (e.g., on a quantum well, a quantum dot, or the like). In some embodiments, the strain adjusting material may be a periodic table Group III material or periodic table Group V material. For example, a phosphorus atom may be incorporated to replace part of the arsenic atoms in the AlGaAs cladding layer. The room temperature lattice constant of AlGaAsP decreases linearly with increasing phosphorous composition. The lattice mismatch of $Al_{0.6}Ga_{0.4}As$ to a GaAs substrate varies from ~0.08% compressive for $Al_{0.6}Ga_{0.4}As$, to lattice matched to GaAs for $Al_{0.6}Ga_{0.4}As_{0.977}P_{0.023}$, to ~0.08% tensile for $Al_{0.6}Ga_{0.4}As_{0.945}P_{0.046}$ In some other embodiments, the material composition of the strain-engineered cladding layer may be a periodic table group III-V ternary alloy, quaternary alloy, or quinternary alloy, and the material composition of the ternary, quaternary, or quinternary alloy may be adjusted for the cladding layer to be compressively strained, lattice matched, or tensile strained to the GaAs substrate.

Examples of quaternary alloy cladding layers that may be lattice matched or slightly mismatched to GaAs includes (but are not limited to) AlGaAsP, InGaAsP, and AlInGaP. For example, $In_{0.49}Ga_{0.45}As_{0.06}P$ has similar bandgap energy as $Al_{0.6}Ga_{0.4}As$ to be used in a cladding layer, but is lattice matched to GaAs substrate, and can have its material composition adjusted to be compressively strained, lattice matched, or tensile strained to the GaAs substrate. Examples of quinternary alloy cladding layers include but are not limited to AlInGaAsP. Quinternary alloys may provide greater design flexibility in bandgap engineering and lattice matching than quaternary alloys.

The strain adjusting material may be incorporated differently in different sections of the cladding layer. For instance, the cladding layer may include two or more sublayers in which an average concentration of the strain adjusting material in one of the sublayers is different than an average concentration of the strain adjusting material in a different one of the sublayers. The sublayer closest to the active region may have a different average concentration than another sublayer. In other examples, a portion of the cladding layer may have a gradient concentration of the strain adjusting material (e.g., the entire cladding layer or some of the cladding layer).

In various embodiments, the laser diode may include more than one cladding layer, and some or all of these cladding layers may be strain-engineered. In the case of more than one of plural cladding layers strain-engineered, each strain-engineered cladding layer may impart an individual stress field in which an aggregate stress field strain-engineers the active region.

In view of the many possible embodiments to which the principles of the disclosed technology may be applied, it should be recognized that the illustrated embodiments are only preferred examples and should not be taken as limiting the scope of the disclosure. We claim as our invention all that comes within the scope and spirit of the appended claims.

The invention claimed is:

1. A laser diode, comprising:
a semiconductor substrate having a material composition with a first lattice constant; and
a plurality of epitaxy layers formed on the semiconductor substrate, the plurality of epitaxy layers including a waveguide layer and cladding layers, wherein the waveguide layer includes an active region having a material composition associated with a target optical wavelength, wherein a second lattice constant of the material composition of the active region is different than the first lattice constant, and wherein the cladding layers consist essentially of Al, Ga, As, and P;
wherein a material composition of an individual one of the cladding layers imparts a stress field on the active region;
wherein the individual one of the cladding layers includes a strain adjusting material, and
wherein the individual one of the cladding layers includes two or more sublayers in which an average concentration of the strain adjusting material in one of the sublayers is different than an average concentration of the strain adjusting material in a different one of the sublayers.

2. The laser diode of claim 1, wherein the individual one of the cladding layers comprises two or more sublayers having two or more uniform material compositions, respectively.

3. The laser diode of claim 2, wherein a first sublayer of the two or more sublayers is closer to the active region than a second sublayer of the two or more sublayers, wherein a degree of lattice mismatch to the first lattice constant in the first sublayer is different than a degree of lattice mismatch to the first lattice constant in the second sublayer.

4. The laser diode of claim 1, wherein the individual one of the cladding layers comprises alternating layers having different degrees of lattice mismatch to the first lattice constant.

5. The laser diode of claim 1, wherein the individual one of the cladding layers comprises a gradient material composition and a gradient lattice constant.

6. The laser diode of claim 1, wherein the strain adjusting material comprises a periodic table Group III material or periodic table Group V material.

7. The laser diode of claim 1, wherein the material composition of the individual one of the cladding layers comprises any periodic table group III-V ternary alloy, quaternary alloy, or quinternary alloy.

8

8. The laser diode of claim 1, wherein the individual one of the cladding layers comprises a p-cladding of the cladding layers.

9. The laser diode of claim 1, wherein the cladding layers comprise a p-cladding and an n-cladding.

10. The laser diode of claim 9, wherein the strain adjusting material is located in the p-cladding.

11. The laser diode of claim 9, wherein the strain adjusting material is located in the n-cladding.

12. The laser diode of claim 9, wherein cladding layers further comprise a p-cap for the p-cladding.

13. The laser diode of claim 9, wherein the n-cladding comprises an inner n-cladding and an outer n-cladding.

14. The laser diode of claim 1, wherein the semiconductor substrate comprises an n-substrate.

15. The laser diode of claim 14, wherein the n-substrate comprises a GaAs n-substrate.

16. The laser diode of claim 1, further comprising a large optical cavity (LOC).

17. The laser diode of claim 1, wherein the waveguide layer further includes an n-waveguide and a p-waveguide, wherein a thickness of the p-waveguide is less than 30% of a thickness of the n-waveguide.

18. The laser diode of claim 1, wherein the laser diode generates laser light with a wavelength of 900 nm or greater.

* * * * *